(12) United States Patent
Chou et al.

(10) Patent No.: US 11,307,725 B2
(45) Date of Patent: Apr. 19, 2022

(54) MASK AND ELECTRONIC DEVICE THEREOF

(71) Applicant: HANNSTAR DISPLAY CORPORATION, Taipei (TW)

(72) Inventors: Mei-Ling Chou, Tainan (TW); Chih-Wei Chen, Tainan (TW); Chia-Yu Liu, Tainan (TW); Ming-Liang Chen, Tainan (TW); Yao-Chih Chuang, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 7 days.

(21) Appl. No.: 17/117,043

(22) Filed: Dec. 9, 2020

(65) Prior Publication Data

US 2021/0405817 A1 Dec. 30, 2021

(30) Foreign Application Priority Data

Jun. 24, 2020 (CN) .......................... 202010586244.8

(51) Int. Cl.
*G06F 3/044* (2006.01)
*H05K 3/00* (2006.01)

(52) U.S. Cl.
CPC ......... *G06F 3/0446* (2019.05); *H05K 3/0073* (2013.01); *G06F 2203/04112* (2013.01); *H05K 2201/09681* (2013.01)

(58) Field of Classification Search
CPC combination set(s) only.
See application file for complete search history.

(56) References Cited

U.S. PATENT DOCUMENTS 8,852,728 B2   10/2014  Matsuda
2015/0277627 A1*  10/2015  Pang ..................... G06F 3/0446
                                                                  345/174

FOREIGN PATENT DOCUMENTS

JP        2008-47355 A      2/2008

* cited by examiner

*Primary Examiner* — Deeprose Subedi
(74) *Attorney, Agent, or Firm* — Winston Hsu

(57) ABSTRACT

A mask including a substrate and a mesh pattern are disclosed along with an electronic device. The mesh pattern, being disposed on the substrate, includes a first striped pattern and a second striped pattern; the first striped pattern includes a first, second, and third section, and the second section is disposed between the first and the third sections; the second striped pattern includes a fourth, fifth, and sixth section, and the fifth section is disposed between the fourth and the sixth sections; the first section has a first extension direction, the fourth section has a second extension direction, and a first included angle is between the first extension direction and the second extension direction; the fifth section and the second section intersect each other while having a second included angle between the two sections, and the second included angle is greater than the first included angle.

16 Claims, 12 Drawing Sheets

$\theta = 50°$ $\theta = 60°$

θ =70°

$\theta = 90°$

MASK AND ELECTRONIC DEVICE THEREOF

BACKGROUND OF THE INVENTION

1. Field of the Invention

The present invention relates to a mask and an electronic device, and more particularly, to an electronic device having a metal mesh structure and a mask for forming the metal mesh structure.

2. Description of the Prior Art

Electronic devices (such as touch panels) are widely adopted in various electronic products as a way for users to communicate with the electronic products without requiring conventional input devices such as a keyboard and or mouse, allowing the size of the electronic product to be reduced and human-machine communications to be more convenient. In an electronic device, electrodes such as touch electrodes of touch panels may include a mesh structure made from metal materials. When a metal mesh structure is used to form touch electrodes, properties inherent to metal may lead to a high reflectance from the touch electrodes, thereby creating undesirable visual effects in the touch panel.

FIG. 1 illustrates a schematic diagram of a partially enlarged area of a metal mesh structure. As shown in FIG. 1, a mesh pattern of a mask 30 includes a first striped pattern 308 and a second striped pattern 310, wherein the first striped pattern 308 and the second striped pattern 310 may intersect each other. An included angle θ is between the first striped pattern 308 and the second striped pattern 310, and the included angle θ is less than 90 degrees. FIG. 2 illustrates a schematic diagram of a partially enlarged metal mesh structure produced by the mask of FIG. 1. It is worth noting that the bright portion of FIG. 2 is the metal mesh structure, and FIG. 1 and FIG. 2 illustrate the included angle θ as 60 degrees. When an exposure process is performed on a photoresist layer, a node 320 at the intersection of the first striped pattern 308 and the second striped pattern 310 will cause diffraction, and the residual photoresist at a region corresponding to the node 320 after a development process has an area greater than that of the node 320 on the mask 30. Therefore, as shown in FIG. 2, a node at the intersection of two metal lines has an increased area. Since the aforementioned nodes are metallic and may reflect light, nodes with large areas are obvious to the user's eyes and may result in undesirable visual effects.

SUMMARY OF THE INVENTION

The present invention aims to solve the technical problem of electrodes of an electronic device (such as the touch electrodes of a touch panel) having a metal mesh structure and a higher reflectance, resulting in undesirable visual effects.

To solve the above technical problem, the present invention provides a mask including a substrate and a mesh pattern, wherein the mesh pattern is disposed on the substrate. The mesh pattern includes a first striped pattern and a second striped pattern, wherein the first striped pattern and the second striped pattern intersect each other. The first striped pattern includes a first section, a second section and a third section, and the second section is disposed between the first section and the third section. The second striped pattern includes a fourth section, a fifth section and a sixth section, and the fifth section is disposed between the fourth section and the sixth section. The first section has a first extension direction, the fourth section has a second extension direction, a first included angle is between the first extension direction and the second extension direction, the fifth section and the second section intersect each other, a second included angle is between the fifth section and the second section, and the second included angle is greater than the first included angle.

To solve the above technical problem, the present invention provides an electronic device including a substrate and a metal mesh structure, wherein the metal mesh structure is disposed on the substrate. The metal mesh structure includes a node, a plurality of inner metal sections and a plurality of outer metal sections. The inner metal sections are connected to the node. Each of the outer metal sections is connected to a corresponding one of the inner metal sections, and each of the inner metal sections is disposed between a corresponding one of the outer metal sections and the node. The outer metal sections include a first outer metal section and a second outer metal section adjacent to the first outer metal section. The first outer metal section has a first extension direction, the second outer metal section has a second extension direction, and a first included angle is between the first extension direction and the second extension direction. The inner metal sections include a first inner metal section and a second inner metal section adjacent to the first inner metal section, the first outer metal section is connected to the first inner metal section, the second outer metal section is connected to the second inner metal section, the first inner metal section has a third extension direction, the second inner metal section has a fourth extension direction, a second included angle is between the third extension direction and the fourth extension direction, and the second included angle is greater than the first included angle.

In the mask of the present invention, the second included angle between the fifth section and the second section is 90 degrees; in the electronic device of the present invention, the second included angle between the third extension direction of the first inner metal section and the fourth extension direction of the second inner metal section is 90 degrees. The abovementioned design may reduce an area of residual photoresist adjacent to the intersection of the fifth section and the second section after an exposure and development process during manufacture and production, and also reduce an area of the metal node produced. In this manner, undesirable visual effects on products caused by metal nodes may be lowered.

These and other objectives of the present invention will no doubt become obvious to those of ordinary skill in the art after reading the following detailed description of the preferred embodiment that is illustrated in the various figures and drawings.

DETAILED DESCRIPTION

To facilitate better understanding of the present invention by those skilled in the art, preferred embodiments of the present invention are outlined below; figures may also be taken in conjunction with the paragraphs below to detail the components of the present invention and the corresponding effects to be achieved. It should be noted that the figures are simplified schematic diagrams that only illustrate components and relationships thereof relevant to the present invention, so that basic structures and/or methods of implementation of the present invention may be more clearly described; actual components and layout thereof may be more complex. Furthermore, for the purpose of illustrative clarity, components shown in the figures of the present invention may not be drawn to scale; the numbers and shapes of the components also may not correlate to those of the actual product. Dimensions and sizes may be adjusted depending on design requirements.

Figure 3A:
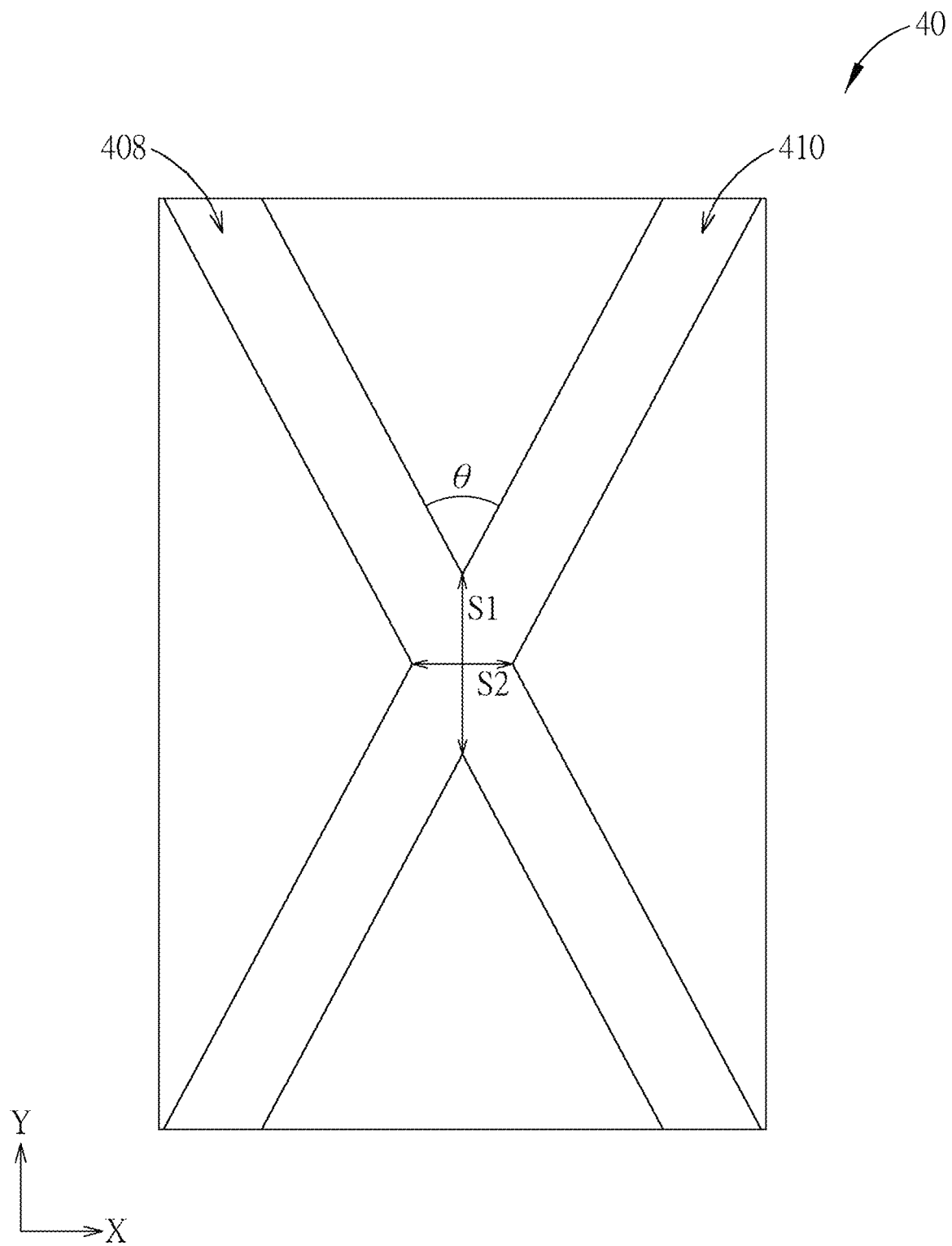
FIG. 3A illustrates an enlarged schematic diagram of a partial area of a mask according to the present invention.
Figure 3B:
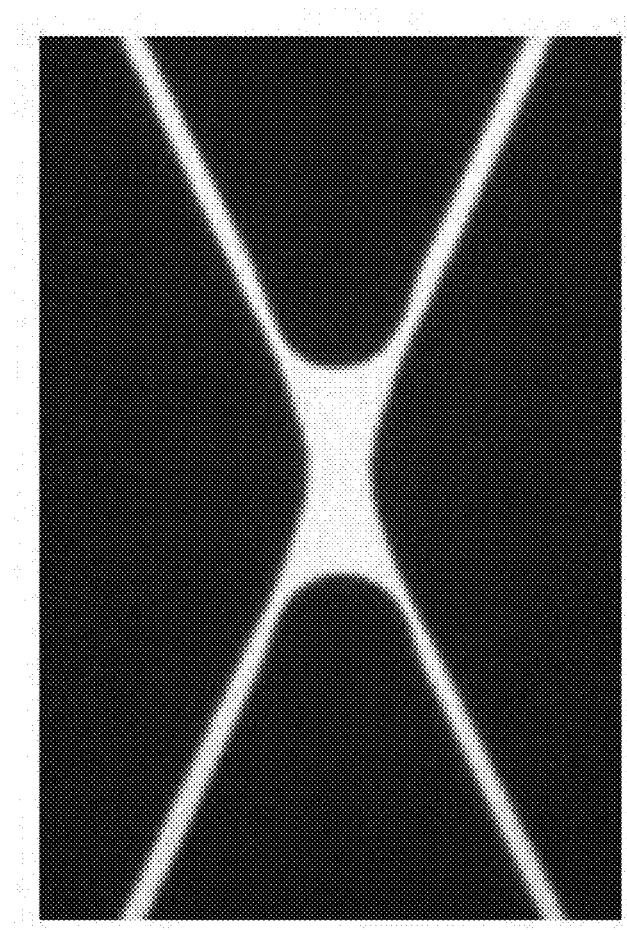
FIG. 3B to FIG. 3E illustrate partially enlarged schematic diagrams of the metal mesh structure produced by the mask of FIG. 3A at an included angle θ of 50, 60, 70, and 90 degrees.
Figure 3C:
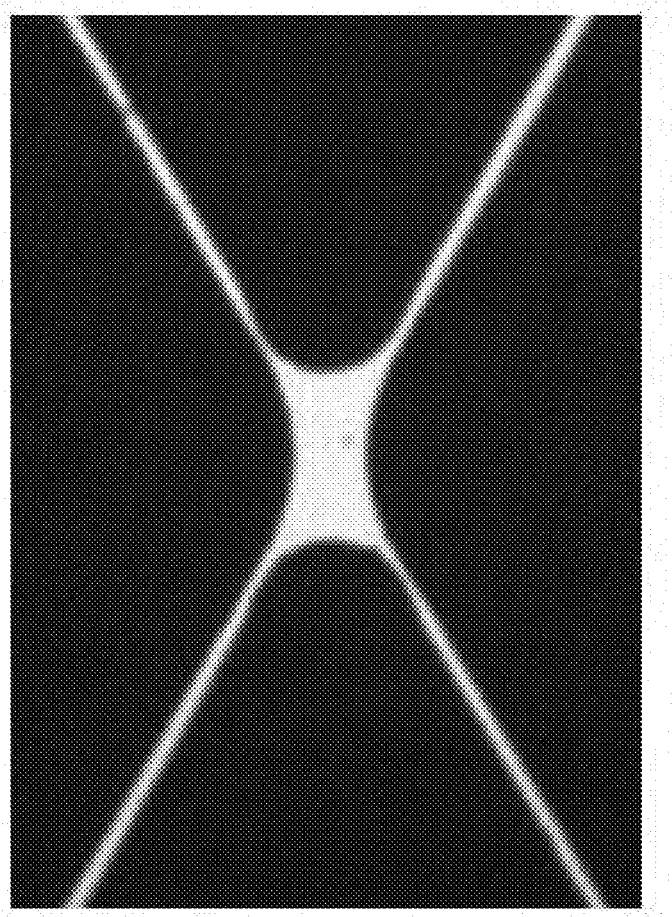
Figure 3D:
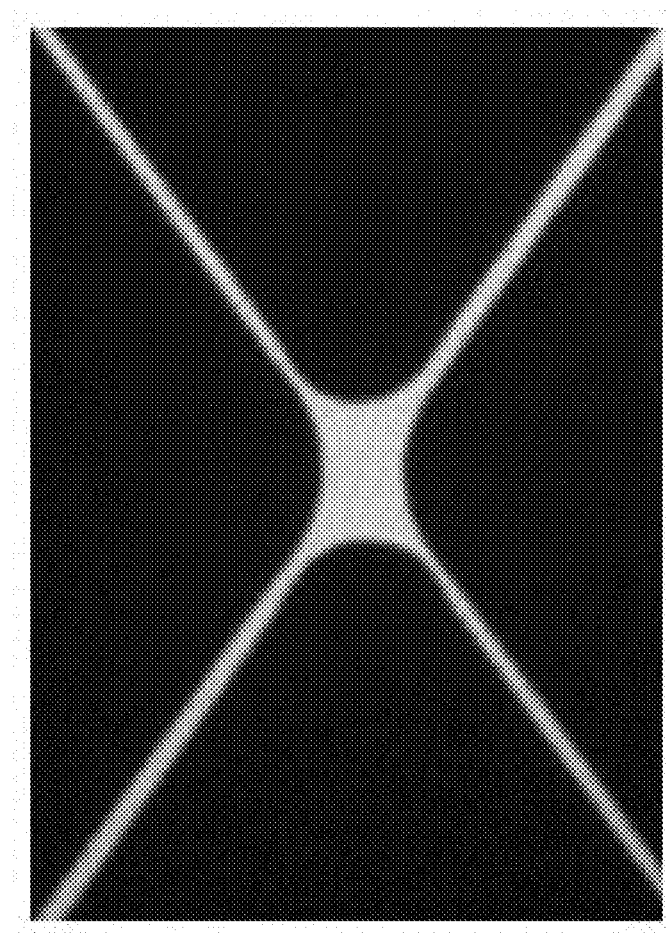
Figure 3E:
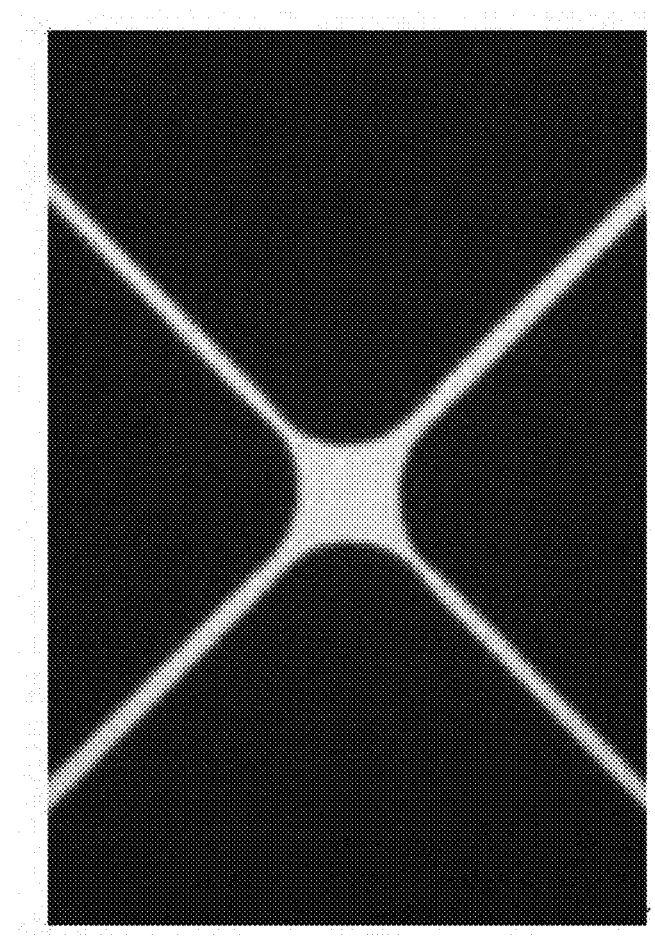

To solve the problem of the node of a metal mesh structure at an intersection of two metal lines having a large area which creates undesirable visual effects, the inventors of the present invention conducted the following experiments. Refer to FIG. 3A to FIG. 3E; FIG. 3A is an enlarged schematic diagram of a partial area of a mask according to the present invention, and FIG. 3B to FIG. 3E are partially enlarged schematic diagrams of the metal mesh structure produced by the mask of FIG. 3A at an included angle θ of 50, 60, 70, and 90 degrees. As shown in FIG. 3A, the mesh pattern of the mask 40 includes a first striped pattern 408 and a second striped pattern 410. The first striped pattern 408 and the second striped pattern 410 intersect each other, and an included angle θ is between the first striped pattern 408 and the second striped pattern 410. The node at the intersection of the first striped pattern 408 and the second striped pattern 410 has a length S1 and a width S2 along a longitudinal direction Y and a transverse direction X, respectively, and an area of the node is a product of the length S1 and the width S2. Refer to Table 1. The design value and the actual value respectively refer to a dimension of the mask and a dimension of the metal mesh structure produced, ΔS1 refers to a difference between the length S1 of the node of the metal mesh structure and the length S1 of the node of the mask, and ΔS2 refers to a difference between the width S2 of the node of the metal mesh structure and the width S2 of the node of the mask. Units of S1, S2, ΔS1, and ΔS2 of Table 1 are micrometers. As shown in FIG. 3B to FIG. 3E and Table 1, when the included angle θ varies from 50, 60, 70, to 90 degrees, the area of the node at the intersection of the metal lines of the metal mesh structure decreases in sequence. Therefore, in the present invention, portions of patterns close to the intersection of the first striped pattern and the second striped pattern of the mesh pattern of the mask may be modified to be two striped patterns with a large included angle, so that the area of the node may be reduced. The following paragraphs will describe how the present invention is implemented.

TABLE 1

| | Design value | | | Actual value | | | | |
|---|---|---|---|---|---|---|---|---|
| θ | S1 | S2 | Node area (S1*S2) | S1 | S2 | ΔS1 | ΔS2 | Node area (S1*S2) |
| 50 | 16.48 | 7.68 | 126.57 | 22.90 | 7.30 | 6.42 | −0.38 | 167.17 |
| 60 | 14.00 | 8.09 | 113.26 | 18.70 | 8.20 | 4.70 | 0.11 | 153.34 |
| 70 | 12.18 | 8.53 | 103.90 | 15.60 | 9.30 | 3.42 | 0.77 | 145.08 |
| 90 | 9.90 | 9.90 | 98.01 | 10.50 | 11.50 | 0.60 | 1.60 | 120.75 |

Figure 4:
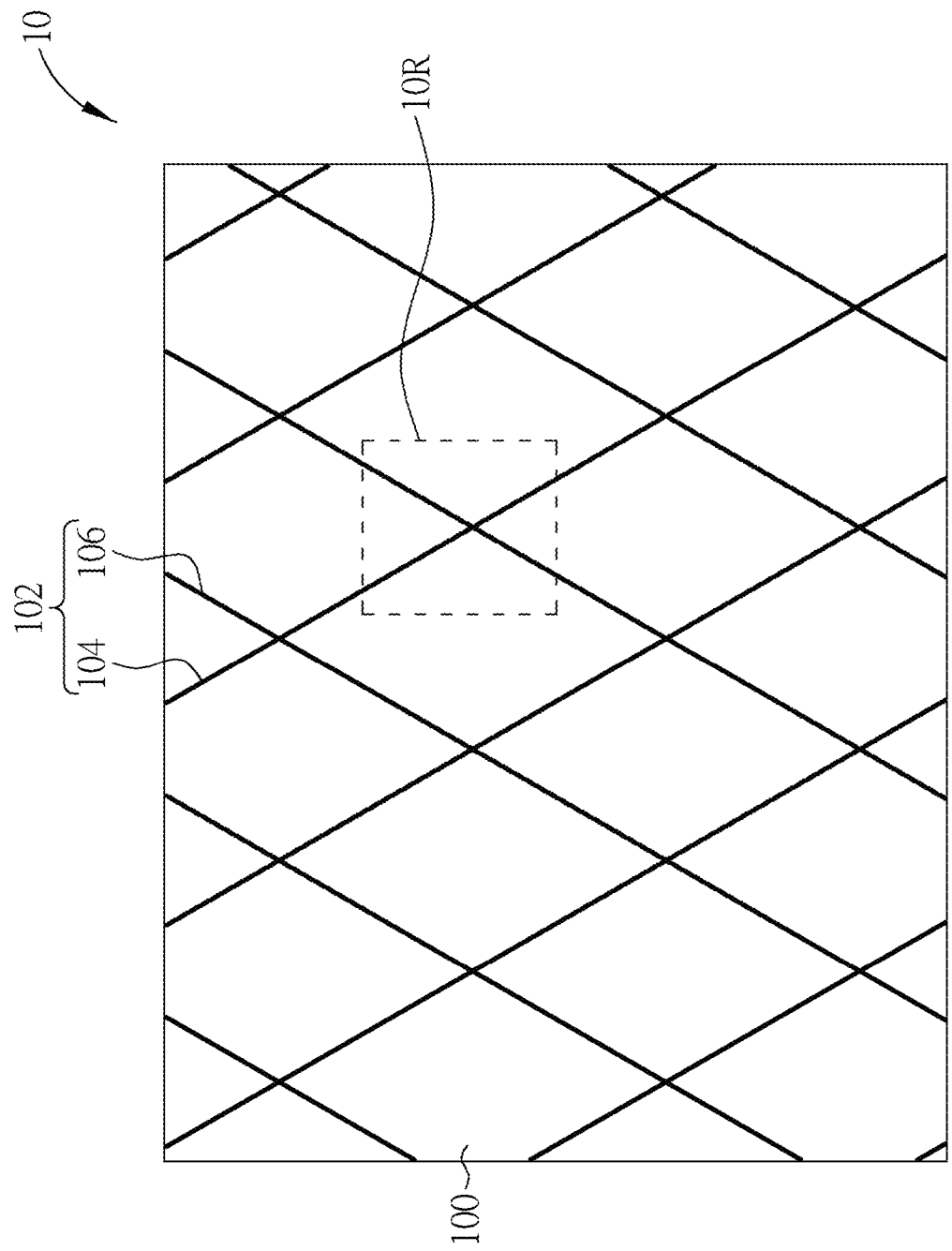
FIG. 4 illustrates a schematic diagram of a mask according to an embodiment of the present invention.
Figure 5:
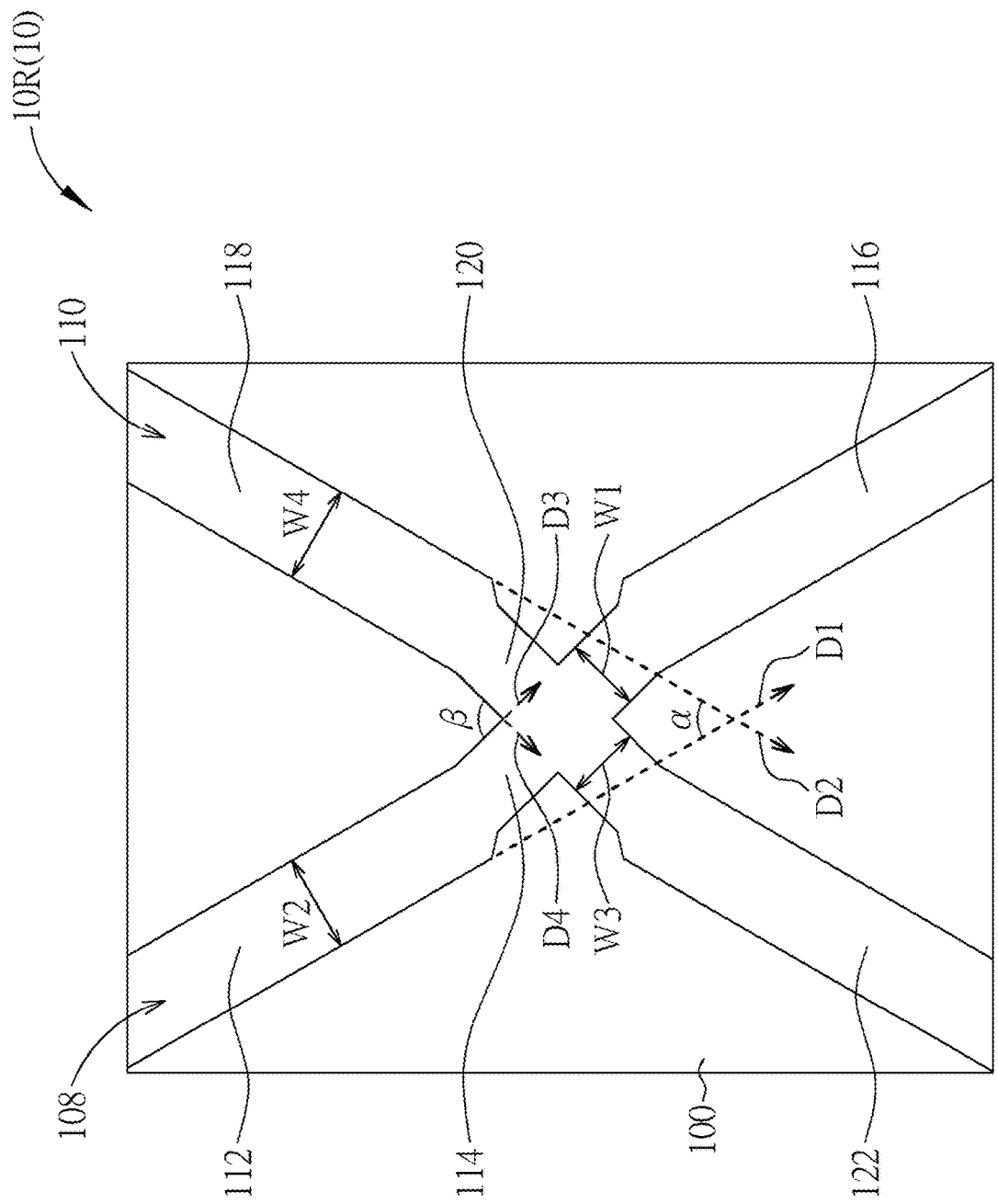
FIG. 5 illustrates an enlarged schematic diagram of a partial area of the mask of FIG. 4.
Figure 6:
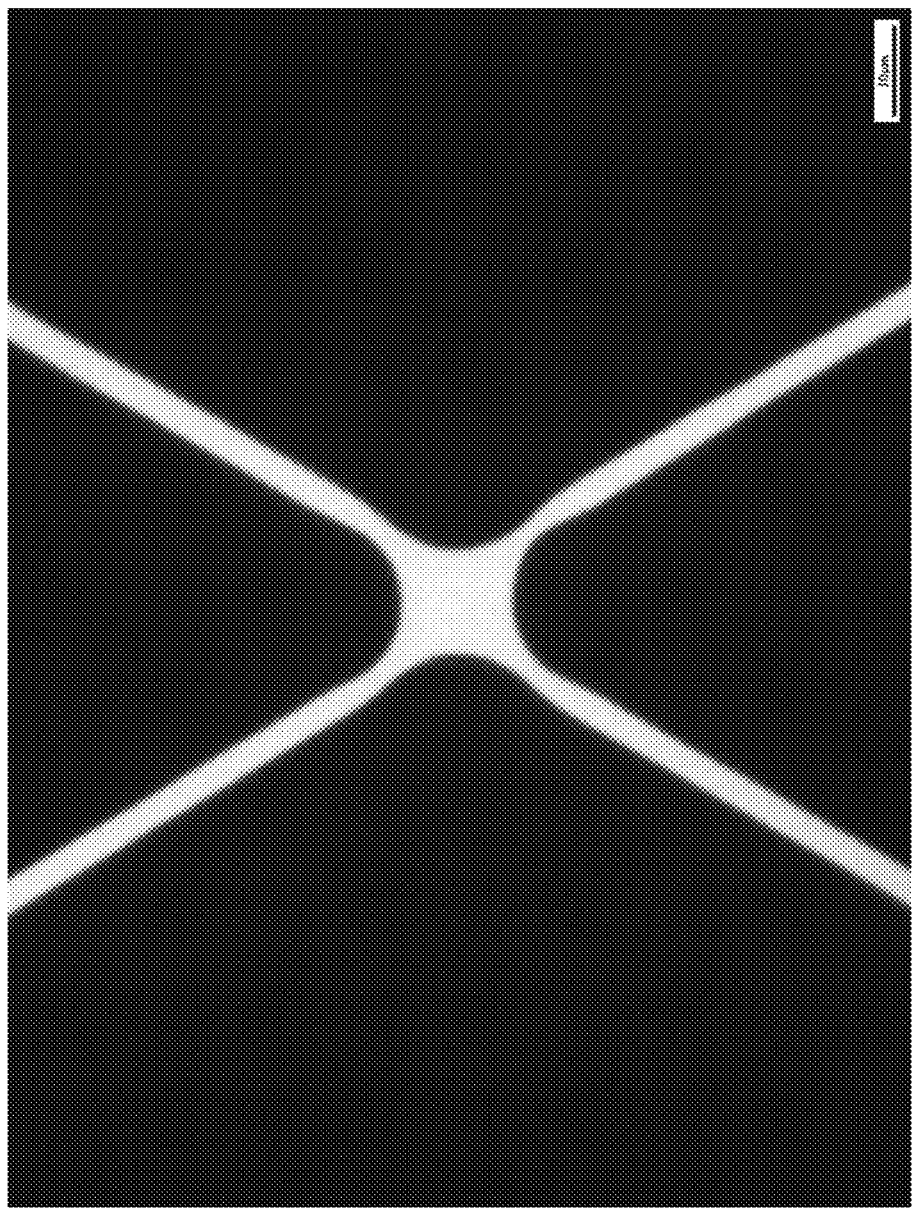
FIG. 6 illustrates a partially enlarged schematic diagram of a metal mesh structure produced by a mask having a second included angle of 90 degrees according to the present embodiment.

Refer to FIG. 4 to FIG. 6. FIG. 4 is a schematic diagram of a mask according to an embodiment of the present invention, FIG. 5 is an enlarged schematic diagram of a partial area of the mask of FIG. 4, and FIG. 6 is a partially enlarged schematic diagram of a metal mesh structure produced by a mask having a second included angle of 90 degrees according to the present embodiment. As shown in FIG. 4, a mask 10 of the present embodiment may include a substrate 100 and a mesh pattern 102, wherein the mesh pattern 102 is disposed on the substrate 100. The mesh pattern 102 may include a plurality of striped patterns 104 and a plurality of striped patterns 106, wherein the striped pattern 104 and the striped pattern 106 may extend in different directions, and the striped pattern 104 and the striped pattern 106 may intersect each other.

In some embodiments, the substrate 100 may include a transparent substrate, such as a quartz substrate, a glass substrate, a plastic substrate, a ceramic substrate or substrates formed using other suitable materials, but not limited thereto. In some embodiments, depending on properties of the photoresist, the striped pattern 104 and/or the striped pattern 106 may be a light-transmitting pattern or a light-blocking pattern.

In some embodiments, the light-blocking pattern may include light-absorbing materials or light-blocking materials, but not limited thereto. In some embodiments, a material of the light-blocking pattern may include chromium, but not limited thereto. Additionally, in some embodiments, the light-transmitting pattern may be partially optically transparent or fully optically transparent, but not limited thereto.

To form a metal mesh structure on another substrate, a metal layer may be formed on the other substrate; subsequently, a photoresist layer (such as a positive photoresist or a negative photoresist) may be formed on the metal layer; then, a photolithography process may be carried out on the photoresist layer to form a patterned photoresist layer; an etching process is then carried out on the metal layer so as to form the metal mesh structure; finally, the patterned photoresist layer is removed; nevertheless, a method to form the metal mesh structure is not limited thereto. In some embodiments, when the striped pattern 104 and/or the striped pattern 106 is a light-blocking pattern, the photolithography process may be performed on the positive photoresist to form the corresponding patterned photoresist layer on the other substrate, but not limited thereto. In some embodiments, when the striped pattern 104 and/or the striped pattern 106 is a light-transmitting pattern, the photolithography process may be performed on the negative photoresist to form the corresponding patterned photoresist layer on the other substrate, but not limited thereto.

FIG. 5 is an enlarged schematic diagram of a partial area 10R of the mask 10 of FIG. 4. As shown in FIG. 5, the mesh pattern 102 (shown in FIG. 4) may include a first striped pattern 108 and a second striped pattern 110, wherein the first striped pattern 108 and the second striped pattern 110 may intersect each other. As an example, the first striped pattern 108 of FIG. 5 may be a portion of the striped pattern 104 of FIG. 4, and the second striped pattern 110 of FIG. 5 may be a portion of the striped pattern 106 of FIG. 4.

As shown in FIG. 5, the first striped pattern 108 may include a first section 112, a second section 114 and a third section 116, wherein the second section 114 may be disposed between the first section 112 and the third section 116. An end of the second section 114 may be connected to the first section 112, and another end of the second section 114 may be connected to the third section 116. The second striped pattern 110 may include a fourth section 118, a fifth section 120 and a sixth section 122, wherein the fifth section 120 may be disposed between the fourth section 118 and the sixth section 122. An end of the fifth section 120 may be connected to the fourth section 118, and another end of the fifth section 120 may be connected to the sixth section 122.

In some embodiments, a shape of each of the first section 112, the third section 116, the fourth section 118 and the sixth section 122 is a straight-line shape. In some embodiments, a shape of each of the second section 114 and the fifth section 120 is a straight-line shape. In some embodiments, the first section 112, the second section 114, the third section 116, the fourth section 118, the fifth section 120 and the sixth section 122 may be straight-line sections, but not limited thereto.

In some embodiments, a portion of the first section 112, the second section 114, the third section 116, the fourth section 118, the fifth section 120 and the sixth section 122 may be a non-straight line section. For example, the second section 114 and the fifth section 120 may be straight-line sections, whereas the first section 112, the third section 116, the fourth section 118 and the sixth section 122 may be non-straight line sections, but not limited thereto.

The first section 112 may have a first extension direction D1, and the fourth section 118 may have a second extension direction D2, wherein a first included angle α may be between the first extension direction D1 and the second extension direction D2. In some embodiments, the third section 116 may also extend along the first extension direction D1, and the sixth section 122 may also extend along the second extension direction D2; therefore, the first included angle α may also be between the extension direction of the third section 116 and the extension direction of the sixth section 122, but not limited thereto.

In the embodiment of FIG. 5, the first included angle α between the first extension direction D1 of the first section 112 and the second extension direction D2 of the fourth section 118 may be less than 90 degrees. For example, in a touch display device, the first included angle α may be adjusted according to different display properties of various types of display panels in order to avoid the Moire effect on the displayed images.

Furthermore, the fifth section 120 and the second section 114 intersect each other, wherein a second included angle β is between the fifth section 120 and the second section 114. As an example, the second section 114 may have a third extension direction D3, and the fifth section 120 may have a fourth extension direction D4, wherein a second included angle β may be between the third extension direction D3 and the fourth extension direction D4, and the second included angle β is different from the first included angle α. As an example, the first extension direction D1 may not be parallel to the third extension direction D3, and the second extension direction D2 may not be parallel to the fourth extension direction D4. In the present embodiment, the second included angle β may be greater than the first included angle α, and the second included angle β may be less than or equal to 90 degrees.

Modifying portions of patterns close to the intersection of the first striped pattern 108 and the second striped pattern 110 of the mesh pattern 102 of the mask 10 to be two striped patterns with a greater included angle (such as having the first included angle α between the first section 112 and the fourth section 118 away from the intersection be less than the second included angle β between the fifth section 120 and the second section 114) may reduce the area of the node. Additionally, as can be seen from FIG. 3A to 3E and Table 1, when the included angle between two sections is 90 degrees, the node has the smallest area. Therefore, modifying portions of patterns close to the intersection of the first striped pattern 108 and the second striped pattern 110 of the mesh pattern 102 of the mask 10 to be two striped patterns such that the included angle between the patterns is 90 degrees (such as having the second included angle β between the fifth section 120 and the second section 114 be 90 degrees) may minimize the area of the node. In this manner, the second included angle β is preferably 90 degrees, but not limited thereto.

In the present embodiment, the second included angle β between the fifth section 120 and the second section 114 of the mask 10 is greater than the first included angle α, which may reduce an area of residual photoresist adjacent to the second included angle β and/or adjacent to the intersection of the fifth section 120 and the second section 114 after an exposure and development process during manufacture and production; the aforementioned configuration may also reduce an area of the subsequently produced metal node at an intersection of two metal lines. Furthermore, the second included angle β is preferably 90 degrees, so as to minimize the area of the node and obtain the best visual effects. Therefore, the metal mesh structure produced using the mask 10 of the present embodiment may reduce issues related to the visual effects of the products caused by the node.

Figure 1:
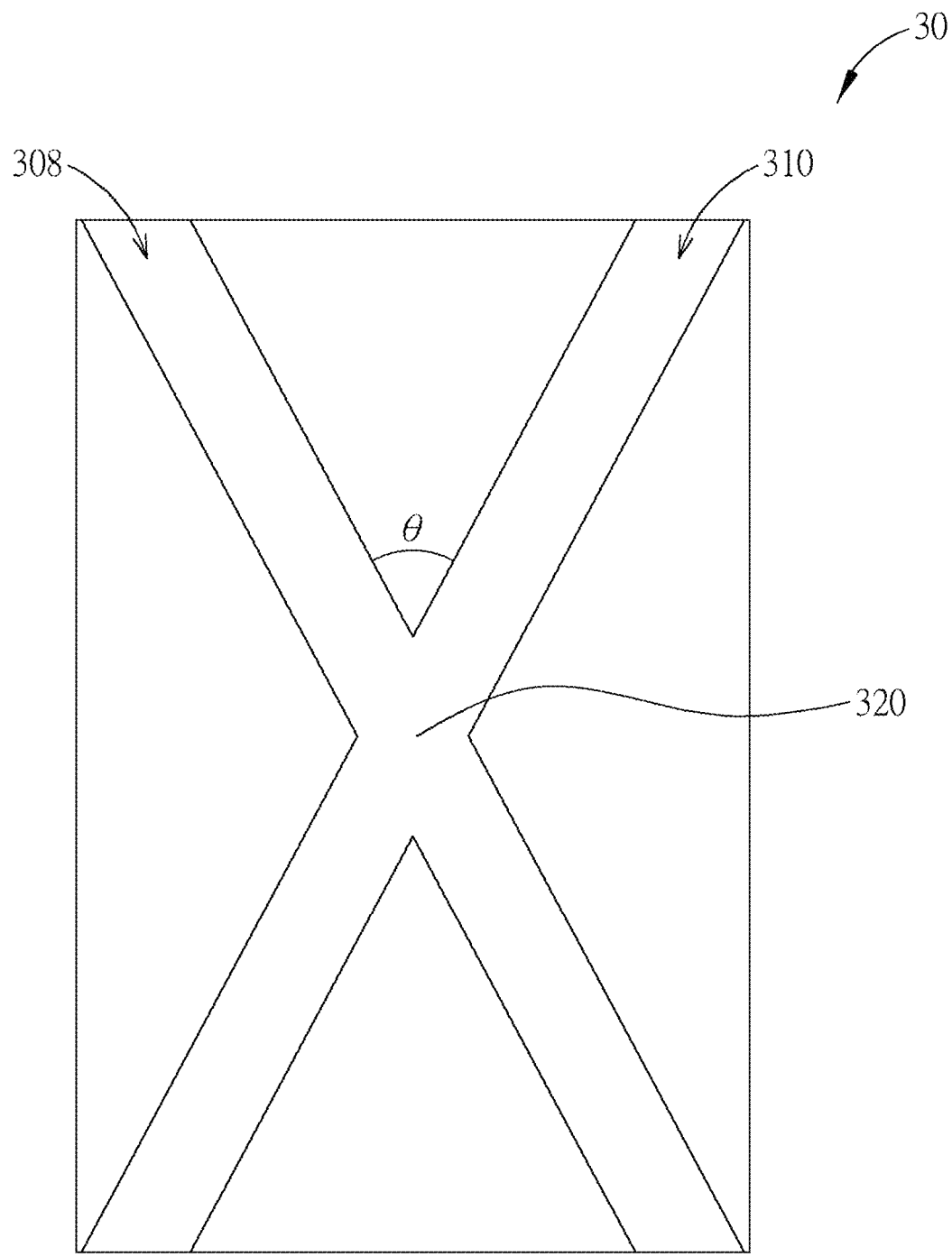
FIG. 1 illustrates an enlarged schematic diagram of a partial area of a mask for producing a metal mesh structure according to the prior art.
Figure 2:
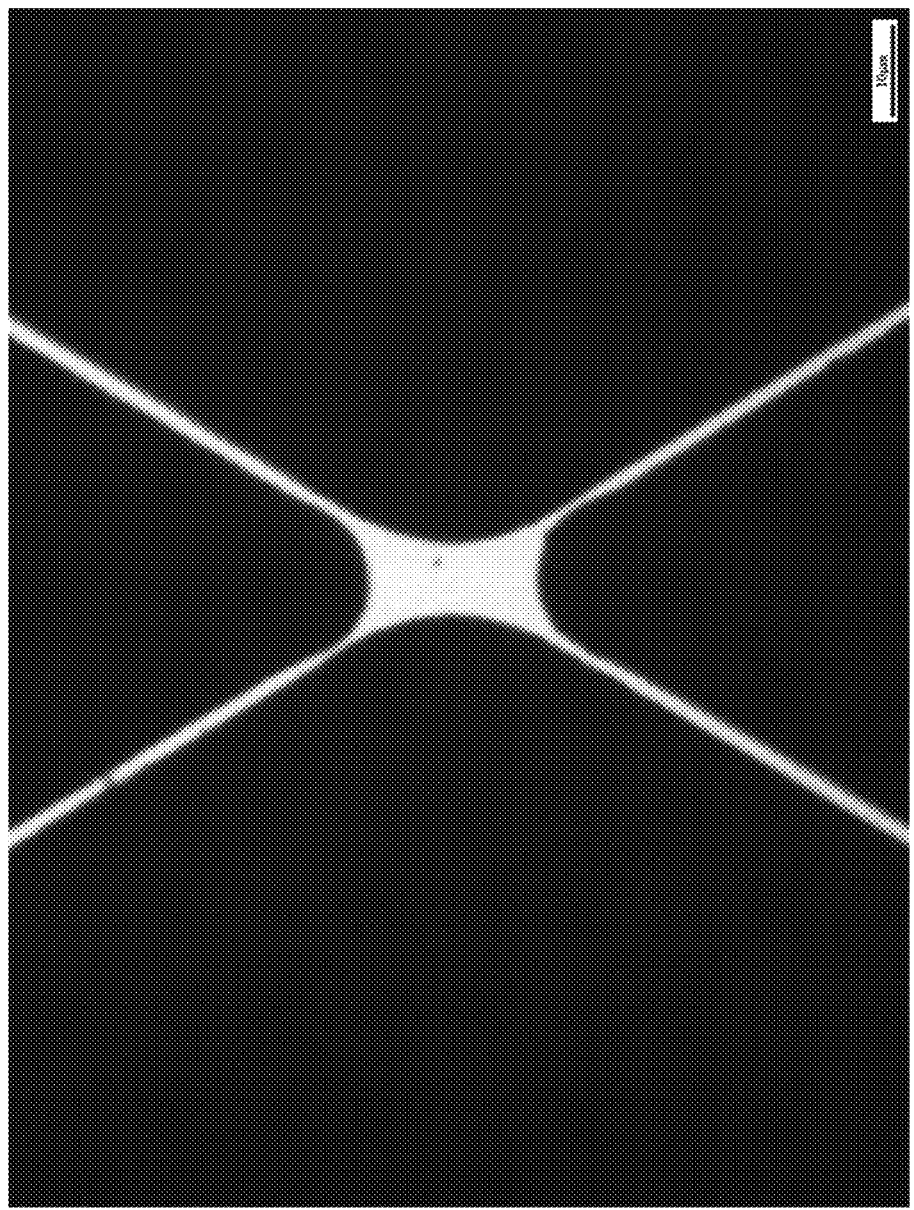
FIG. 2 illustrates a partially enlarged schematic diagram of a metal mesh structure produced by the mask of FIG. 1.

FIG. 6 is a partially enlarged schematic diagram of the metal mesh structure produced by the mask of FIG. 5 having the first included angle α as 60 degrees and the second included angle as 90 degrees. Refer to FIG. 1 and FIG. 6 simultaneously; when compared to the node of FIG. 1 having a greater area, the technology of the present invention may significantly reduce the area of the node to improve the visual effects of the products.

As shown in FIG. 5, the second section 114 has a first width W1, wherein the first section 112 and the third section 116 have a second width W2. The first width W1 may (for example) be a width of the second section 114 measured along a direction perpendicular to the third extension direction D3 (the extension direction of the second section 114), but not limited thereto. The second width W2 may (for example) be a width of the third section 116 and/or a width of the first section 112 measured along a direction perpendicular to the first extension direction D1 (the extension direction of the first section 112 and/or the third section 116), but not limited thereto. In the present embodiment, the second width W2 may be greater than the first width W1, but not limited thereto.

In the present embodiment, the fifth section 120 has a third width W3, wherein the fourth section 118 and the sixth section 122 both have a fourth width W4. The third width W3 may for example be a width of the fifth section 120 measured along a direction perpendicular to the fourth extension direction D4 (the extension direction of the fifth section 120), but not limited thereto. The fourth width W4 may (for example) be a width of the sixth section 122 measured along a direction perpendicular to the second extension direction D2 (the extension direction of the fourth section 118 and/or the sixth section 122), but not limited thereto. In some embodiments, the fourth width W4 is greater than the third width W3, but not limited thereto. In some embodiments, the fourth width W4 may be equal to the second width W2, and the third width W3 may be equal to the first width W1, but not limited thereto.

In the present embodiment, a reduced width of the second section 114 and the fifth section 120 may reduce the area of residual photoresist adjacent to the intersection of the fifth section 120 and the second section 114 after the exposure and development process; the aforementioned configuration may also reduce the area of the subsequently produced metal node at an intersection of two metal lines. Therefore, the metal mesh structure produced by the mask 10 of the present embodiment may reduce the undesirable visual effects created by the node on the product. In the present embodiment, a greater width of the first section 112, the third section 116, the fourth section 118 and the sixth section 122 may reduce a probability of the metal lines breaking in the subsequently produced metal mesh structure, thereby improving product reliability.

As an example, in some embodiments, a ratio of the second width W2 to the first width W1 may be greater than or equal to 1.5 and less than or equal to 2, but not limited thereto. In some embodiments, a ratio of the fourth width W4 to the third width W3 may be greater than or equal to 1.5 and less than or equal to 2, but not limited thereto.

Figure 7:
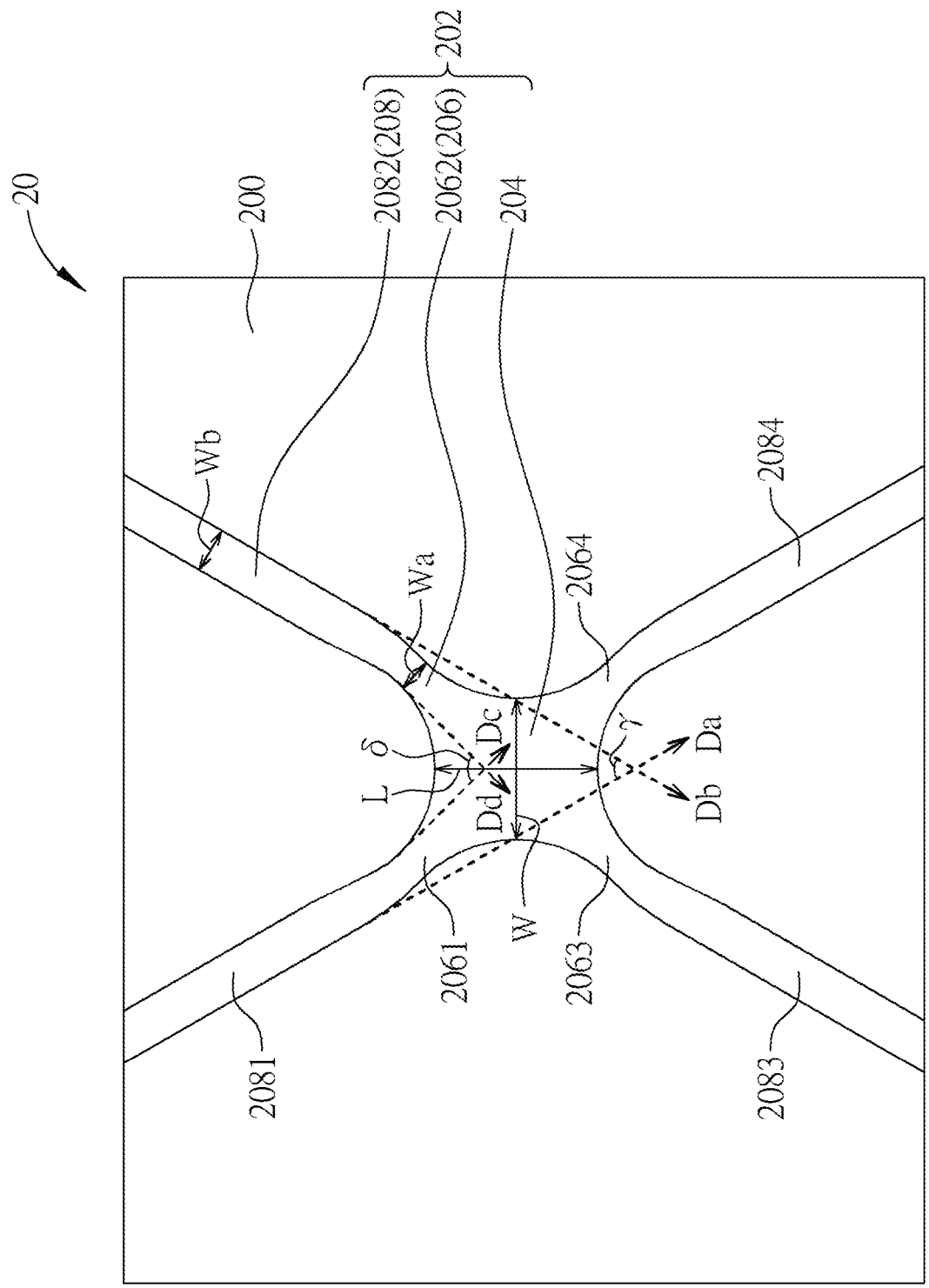
FIG. 7 illustrates a partially enlarged schematic diagram of a metal mesh structure of an electronic device produced by the mask of FIG. 5.

Refer to FIG. 7, which illustrates a partially enlarged schematic diagram of the metal mesh structure of the electronic device produced by the mask of FIG. 5. As shown in FIG. 7, an electronic device 20 of the present embodiment may include a substrate 200 and a metal mesh structure 202, wherein the metal mesh structure 202 may be disposed on the substrate 200. The metal mesh structure 202 may be produced using the mask 10 of FIG. 5. In some embodiments, the substrate 200 may be a rigid substrate or a soft/flexible substrate, but not limited thereto. In some embodiments, the metal lines of the metal mesh structure 202 (such as the inner metal section 206 and/or the outer metal section 208) may be a single-layered structure or a stacked structure, and a material of the metal lines may include aluminum, copper, silver, gold, molybdenum, titanium or other suitable materials, but not limited thereto.

As shown in FIG. 7, the metal mesh structure 202 may include a node 204, a plurality of inner metal sections 206 and a plurality of outer metal sections 208. The inner metal sections 206 are connected to the node 204, each of the outer metal sections 208 is connected to a corresponding one of the inner metal sections 206, and each of the inner metal sections 206 is disposed between a corresponding one of the outer metal sections 208 and the node 204. As an example, four inner metal sections 206 may be connected to the same node 204, and each of the inner metal sections 206 may be connected to one outer metal section 208, but not limited thereto.

The outer metal sections 208 may include a first outer metal section 2081 and a second outer metal section 2082 adjacent to the first outer metal section 2081. As shown in FIG. 7, the first outer metal section 2081 may be adjacent to the second outer metal section 2082 along a transverse direction X, but not limited thereto. The first outer metal section 2081 may have a first extension direction Da, and the second outer metal section 2082 may have a second extension direction Db, wherein a first included angle $\gamma$ is included between the first extension direction Da and the second extension direction Db.

As shown in FIG. 7, the outer metal sections 208 may further include a third outer metal section 2083 and a fourth outer metal section 2084 adjacent to the third outer metal section 2083, wherein the third outer metal section 2083 may be adjacent to the fourth outer metal section 2084 along the transverse direction X, but not limited thereto. Furthermore, the third outer metal section 2083 may be adjacent to the first outer metal section 2081 along a longitudinal direction Y, and the fourth outer metal section 2084 may be adjacent to the second outer metal section 2082 along the longitudinal direction Y, but not limited thereto. Additionally, the longitudinal direction Y may be perpendicular to the transverse direction X, but not limited thereto.

In some embodiments, the fourth outer metal section 2084 may also extend along the first extension direction Da, and the third outer metal section 2083 may also extend along the second extension direction Db; therefore, the extension direction of the third outer metal section 2083 and the extension direction of the fourth outer metal section 2084 may also have the first included angle $\gamma$, but not limited thereto.

In the embodiment of FIG. 7, the first included angle $\gamma$ may be less than 90 degrees. For example, in a touch display device, the first included angle $\gamma$ may be adjusted according to different display properties of various types of display panels in order to avoid the Moire effect on the displayed images. The first included angle $\gamma$ may be equal to the first included angle $\alpha$ of the mask in FIG. 5, but not limited thereto. In some embodiments, effects from the photolithography and etching process may result in the first included angle $\gamma$ being slightly different from the first included angle $\alpha$ of the mask in FIG. 5.

The inner metal sections 206 may include a first inner metal section 2061 and a second inner metal section 2062 adjacent to the first inner metal section 2061. As shown in FIG. 7, the first inner metal section 2061 may be adjacent to the second inner metal section 2062 along the transverse direction X, but not limited thereto. The first outer metal section 2081 is connected to the first inner metal section 2061, and the second outer metal section 2082 is connected to the second inner metal section 2062. The first inner metal section 2061 may have a third extension direction Dc, and the second inner metal section 2062 may have a fourth extension direction Dd, where a second included angle $\delta$ is between the third extension direction Dc and the fourth extension direction Dd, and the second included angle $\delta$ is different from the first included angle $\gamma$. In the present embodiment, the second included angle $\delta$ may be greater than the first included angle $\gamma$, and the second included angle $\delta$ may be less than or equal to 90 degrees. The second included angle $\delta$ may be equal to the second included angle $\beta$ of the mask of FIG. 5, but not limited thereto. In some embodiments, effects from the photolithography and etching process may result in the second included angle $\delta$ being slightly different from the second included angle $\beta$ of the mask in FIG. 5.

As shown in FIG. 7, the inner metal sections 206 may further include a third inner metal section 2063 and a fourth inner metal section 2064 adjacent to the third inner metal section 2063, wherein the third inner metal section 2063 may be adjacent to the fourth inner metal section 2064 along the transverse direction X, but not limited thereto. Furthermore, the third inner metal section 2063 may be adjacent to the first inner metal section 2061 along the longitudinal direction Y, and the fourth inner metal section 2064 may be adjacent to the second inner metal section 2062 along the longitudinal direction Y, but not limited thereto.

As shown in FIG. 7, an end of the first inner metal section 2061 may be connected to the node 204, and another end of the first inner metal section 2061 may be connected to the first outer metal section 2081. An end of the second inner metal section 2062 may be connected to the node 204, and another end of the second inner metal section 2062 may be connected to the second outer metal section 2082. An end of the third inner metal section 2063 may be connected to the node 204, and another end of the third inner metal section 2063 may be connected to the third outer metal section 2083. An end of the fourth inner metal section 2064 may be connected to the node 204, and another end of the fourth inner metal section 2064 may be connected to the fourth outer metal section 2084.

In some embodiments, the fourth inner metal section 2064 may also extend along the third extension direction Dc, and the third inner metal section 2063 may also extend along the fourth extension direction Dd; therefore, the second included angle δ may also be between the extension direction of the third inner metal section 2063 and the extension direction of the fourth inner metal section 2064, but not limited thereto.

In some embodiments, the node 204 may have a length L along the longitudinal direction Y and a width W along the transverse direction X, wherein a ratio of the length L to the width W may be greater than or equal to 0.8 and less than or equal to 2.0, preferably greater than or equal to 0.8 and less than or equal to 1.2, but not limited thereto.

In some embodiments, each of the inner metal sections 206 may have a first width Wa, and each of the outer metal sections 208 may have a second width Wb, but not limited thereto. The first width Wa may be a width of the inner metal section 206 measured along a direction perpendicular to the extension direction of the inner metal section 206 (such as the third extension direction Dc or the fourth extension direction Dd), but not limited thereto. The second width Wb may be a width of the outer metal section 208 measured along a direction perpendicular to the extension direction of the outer metal section 208 (such as the first extension direction Da or the second extension direction Db), but not limited thereto.

In some embodiments, the second width Wb may be greater than the first width Wa, but not limited thereto. In some embodiments, the width of the plurality of inner metal sections 206 may not be completely identical, and the width of the plurality of outer metal sections 208 may also not be completely identical; however, the width of the outer metal section 208 may still be greater than the width of the inner metal section 206, but not limited thereto.

As an example, in some embodiments, a ratio of the second width Wb to the first width Wa may be greater than or equal to 1.5 and less than or equal to 2, but not limited thereto.

Figure 8:
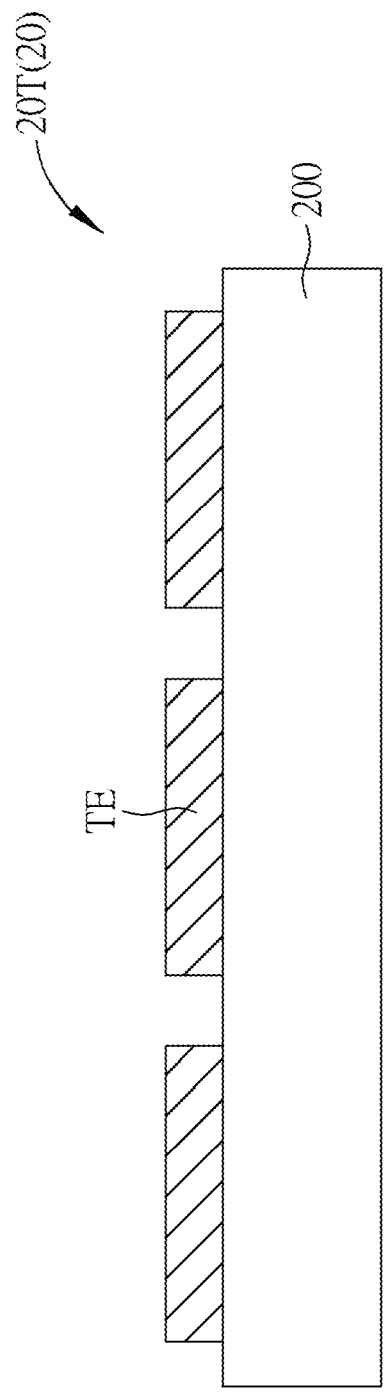
FIG. 8 illustrates a schematic diagram of the electronic device according to an embodiment of the present invention.

Refer to FIG. 8, which illustrates a schematic diagram of the electronic device according to an embodiment of the present invention. In some embodiments, the electronic device 20 may include a touch panel 20T, but not limited thereto. The touch panel 20T may include a plurality of touch electrodes TE disposed on the substrate 200, and each of the touch electrodes TE may include the metal mesh structure 202 (as shown in FIG. 7), but not limited thereto. For example, the touch panel 20T of FIG. 8 may be an Out-Cell type touch panel, but not limited thereto. In some embodiments, the touch electrodes of an On-Cell type touch panel or an In-Cell type touch panel may include the metal mesh structure 202 of the present invention, but not limited thereto. In some embodiments, the metal mesh structure 202 of the present invention may also be used to form electrodes or signal lines of suitable types of electronic devices, but not limited thereto.

In summary, within the mask of the present invention, the second included angle between the fifth section and the second section is greater than the first included angle between the fourth section and the first section. The aforementioned mask design may reduce the area of residual photoresist adjacent to the intersection of the fifth section and the second section after the exposure and development process during manufacturing, and also reduce the area of the metal node produced. In this manner, undesirable visual effects on products caused by metal nodes may be lowered. In electronic devices produced by the aforementioned mask, the second included angle between the third extension direction of the first inner metal section and the fourth extension direction of the second inner metal section is greater than the first included angle between the first extension direction of the first outer metal section and the second extension direction of the second outer metal section.

Furthermore, in the mask of the present invention, each of the widths of the second section and the fifth section is less than each of widths of the first section, the third section, the fourth section and the sixth section. Such design may reduce the area of residual photoresist adjacent to the intersection of the fifth section and the second section after the exposure and development process during manufacturing, may reduce the area of the metal node produced, and may reduce undesirable visual effects caused by metal nodes on the products. The design may also reduce the chance of the metal lines/sections of the metal mesh structure breaking, thereby improving product reliability. In the electronic devices produced by the aforementioned mask, the inner metal sections have a smaller width, and the outer metal sections have a greater width.

Paragraphs above only serve to illustrate preferred embodiments of the present invention, and are not used to limit the scope of the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A mask, comprising:
a substrate; and
a mesh pattern disposed on the substrate, wherein the mesh pattern comprises:
 a first striped pattern and a second striped pattern, wherein the first striped pattern and the second striped pattern intersect each other;
wherein the first striped pattern comprises a first section, a second section and a third section, and the second section is disposed between the first section and the third section;
wherein the second striped pattern comprises a fourth section, a fifth section and a sixth section, and the fifth section is disposed between the fourth section and the sixth section; and wherein the first section has a first extension direction, the fourth section has a second extension direction, a first included angle is between the first extension direction and the second extension direction, the fifth section and the second section intersect each other, a second included angle is between the fifth section and the second section, and the second included angle is greater than the first included angle.

2. The mask of claim 1, wherein the second included angle is 90 degrees.

3. The mask of claim 1, wherein the third section extends along the first extension direction, and the sixth section extends along the second extension direction.

4. The mask of claim 1, wherein the second section has a first width, the first section has a second width, the fifth section has a third width, and the fourth section has a fourth width, wherein the second width is greater than the first width, and the fourth width is greater than the third width.

5. The mask of claim 4, wherein the first width is equal to the third width, and the second width is equal to the fourth width.

6. The mask of claim 4, wherein a ratio of the second width to the first width is greater than or equal to 1.5 and less than or equal to 2, and a ratio of the fourth width to the third width is greater than or equal to 1.5 and less than or equal to 2.

7. The mask of claim 4, wherein a width of the third section is equal to the second width, and a width of the sixth section is equal to the fourth width.

8. The mask of claim 4, wherein a shape of each of the first section, the third section, the fourth section and the sixth section is a straight-line shape.

9. The mask of claim 8, wherein a shape of each of the second section and the fifth section is a straight-line shape.

10. An electronic device, comprising:
a substrate; and
a metal mesh structure disposed on the substrate, wherein the metal mesh structure comprises:
a node;
a plurality of inner metal sections, wherein the inner metal sections are connected to the node; and
a plurality of outer metal sections, wherein each of the outer metal sections is connected to a corresponding one of the inner metal sections, and each of the inner metal sections is disposed between a corresponding one of the outer metal sections and the node;
wherein the outer metal sections comprise a first outer metal section and a second outer metal section adjacent to the first outer metal section, the first outer metal section has a first extension direction, the second outer metal section has a second extension direction, a first included angle is between the first extension direction and the second extension direction, the inner metal sections comprise a first inner metal section and a second inner metal section adjacent to the first inner metal section, the first outer metal section is connected to the first inner metal section, the second outer metal section is connected to the second inner metal section, the first inner metal section has a third extension direction, the second inner metal section has a fourth extension direction, a second included angle is between the third extension direction and the fourth extension direction, and the second included angle is greater than the first included angle.

11. The electronic device of claim 10, wherein the second included angle is 90 degrees.

12. The electronic device of claim 10, wherein each of the first inner metal section and the second inner metal section has a first width, each of the first outer metal section and the second outer metal section has a second width, and the second width is greater than the first width.

13. The electronic device of claim 12, wherein a ratio of the second width to the first width is greater than or equal to 1.5 and less than or equal to 2.

14. The electronic device of claim 10, wherein the node has a length and a width, and a ratio of the length to the width is greater than or equal to 0.8 and less than or equal to 2.0.

15. The electronic device of claim 14, wherein the ratio of the length to the width is greater than or equal to 0.8 and less than or equal to 1.2.

16. The electronic device of claim 10, wherein the electronic device comprises a touch panel, and the touch panel comprises a plurality of touch electrodes, wherein each of the touch electrodes comprises the metal mesh structure.

* * * * *